United States Patent [19]

Morizuka

[11] Patent Number: 5,053,846

[45] Date of Patent: Oct. 1, 1991

[54] SEMICONDUCTOR BIPOLAR DEVICE WITH PHOSPHORUS DOPING

[75] Inventor: Kouhei Morizuka, Yokohama, Japan

[73] Assignee: Kabushiki Kaisha Toshiba, Kawasaki, Japan

[21] Appl. No.: 559,410

[22] Filed: Jul. 26, 1990

Related U.S. Application Data

[63] Continuation of Ser. No. 287,585, Dec. 10, 1988, abandoned, which is a continuation of Ser. No. 897,285, Aug. 18, 1986, abandoned.

[30] Foreign Application Priority Data

Aug. 26, 1985 [JP] Japan .................. 60-187002
Aug. 26, 1985 [JP] Japan .................. 60-187005

[51] Int. Cl.$^5$ ............................................ H01L 29/72
[52] U.S. Cl. ..................................... 357/34; 357/16; 357/63; 357/22
[58] Field of Search ................. 357/34, 34 HB, 16, 22, 357/63

[56] References Cited

U.S. PATENT DOCUMENTS

| | | | |
|---|---|---|---|
| 3,596,148 | 7/1971 | McNeely | 357/63 X |
| 3,649,882 | 3/1972 | Hoffman et al. | 357/63 X |
| 4,226,650 | 10/1980 | Takahashi et al. | 357/34 X |
| 4,383,869 | 5/1983 | Liu | 148/1.5 |
| 4,654,960 | 4/1987 | McLevige et al. | 357/34 X |
| 4,667,218 | 5/1987 | Takahashi et ál. | 357/34 X |

FOREIGN PATENT DOCUMENTS

| | | | |
|---|---|---|---|
| 0132025 | 1/1985 | European Pat. Off. | |
| 0177246 | 4/1986 | European Pat. Off. | 357/34 HB |
| 56-76564 | 6/1981 | Japan | 357/63 |

OTHER PUBLICATIONS

Morizuka et al., "Collector-Top GaAs/AlGaAs Heterojunction Bipolar Transistors for High-Speed Digital ICs," *Electronics Letters*, vol. 22, No. 6, Mar. 1986, pp. 315-316.

Demsky et al., "Technique for Counteracting Epitaxial Autodoping," *IBM Technical Disclosure Bulletin*, vol. 13, No. 3, Aug. 1970, pp. 807-808.

Edel et al., "Stress Relief by Counterdoping," *IBM Technical Disclosure Bulletin*, vol. 13, No. 3, Aug. 1970, p. 632.

Japanese Journal of Applied Physics, vol. 22, No. 6, Part 2, Jun. 1983, pp. L373-L375, Tokyo, JP; J. Kasahara et al.; "Formation of p+-layer in GaAs by dual implantation of Zn and As".

Patent Abstracts of Japan, vol. 9, No. 222 (C-302) (1945), Sep. 9, 1985; & JP-A-60 86 100 (Sony K.K.) May 15, 1985.

Journal of the Electrochemical Society, vol. 132, No. 1, Jan. 1985, pp. 186-189, Manchester, New Hampshire, U.S.: P. M. Campbell et al.; "Beryllium ion-implanted junctions in GaAs with submicron lateral diffusion".

Nuclear Instruments & Methods, vol. 182/183, part 2, Apr./May 1981, pp. 625-629, North-Holland Publishing Co., Amsterdam, NL; H. Krautle; "Effect of dual implantation on the amphoteric behavior of group IV ion implanted GaAs".

*Primary Examiner*—William Mintel
*Attorney, Agent, or Firm*—Foley & Lardner

[57] ABSTRACT

A method of manufacturing semiconductor devices by ion implantation, comprising the steps of, i) implanting P ions and ions selected from Si or Group II elements to the same region of GaAs or AlGaAs material, ii) performing a heat treatment to said ion implanted region for activation. Also disclosed are semiconductor devices manufactured according to this method.

10 Claims, 12 Drawing Sheets

SEMICONDUCTOR BIPOLAR DEVICE WITH PHOSPHORUS DOPING

This application is a continuation, of application Ser. No. 07/287,585, filed Dec. 16, 1988 which is a continuation of Ser. No. 06/897,285 filed Aug. 18, 1986, both now abandoned.

BACKGROUND OF THE INVENTION

The present invention relates to semiconductor devices and to a manufacturing method of semiconductor devices that makes use of semiconductor compounds of Group III-V elements, such as GaAs, and in particular, to an improvement in the process of forming a p- or n-type ion implanted layer.

Because of their large electron mobility, semiconductor compounds of Group III-V elements such as GaAs have been investigated for their application to electronic devices that are operated at high speed.

In such devices, there is required an especially high degree of controllability so that the ion implantation method is now being adopted almost exclusively in place of Zn diffusion method that has been used widely in the past.

For instance, in the manufacture of HBT (Heterojunction Bipolar Transistor), ion implantation of p-type impurities is performed in the process of formation of a high concentration external base layer for taking out a base electrode. In this case, as a kind of ion for the p-type impurities, use is made of beryllium (Be) or magnesium (Mg) which possess a relatively large projection range.

However, one technical problem associated with this existing technique is that it is difficult to form a high concentration p-type layer by means of the ion implantation method.

Figure 1:
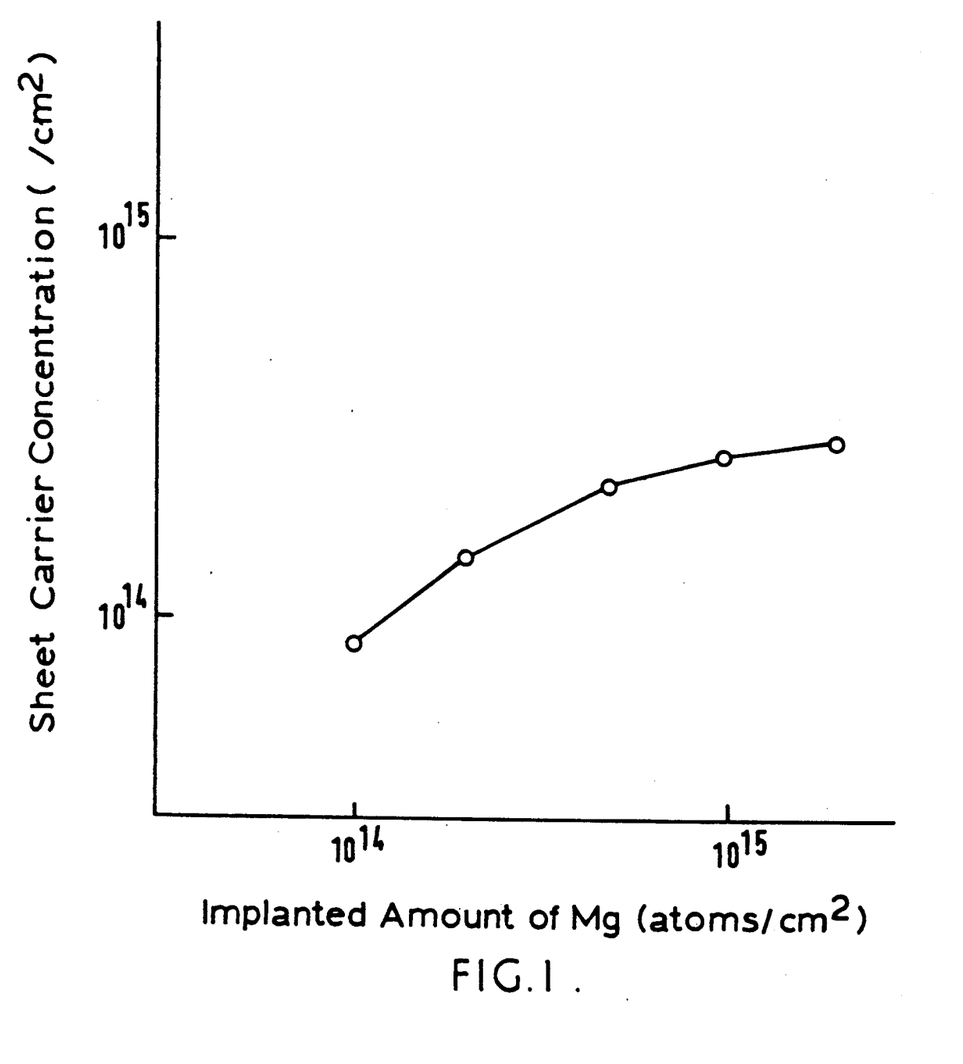
FIG. 1 is a diagram showing the sheet carrier concentration when Mg is implanted in a GaAs substrate.

FIG. 1 illustrates the relationship between the sheet carrier concentration and the amount of ions implanted for a p-type layer which is obtained by implanting Mg in a semi-insulating GaAs substrate with an accelerating energy of 180 KeV, and by applying a heat treatment by irradiation with a halogen lamp, while suppressing dissociation of As by covering the surface with an SiO$_2$ film obtained by CVD (Chemical Vapor Deposition) method. Starting with the implanted amount that exceeds $2 \times 10^{14}$ atoms/cm$^2$, the proportionality between the sheet carrier concentration and the implanted amount begins to deteriorate, and the sheet carrier concentration reaches only the low level of $3 \times 10^{14}$/cm$^2$ at the implanted amount of $2 \times 10^{15}$ atoms/cm$^2$. This means that only 15% of the implanted Mg is acting as acceptors.

Figure 2:
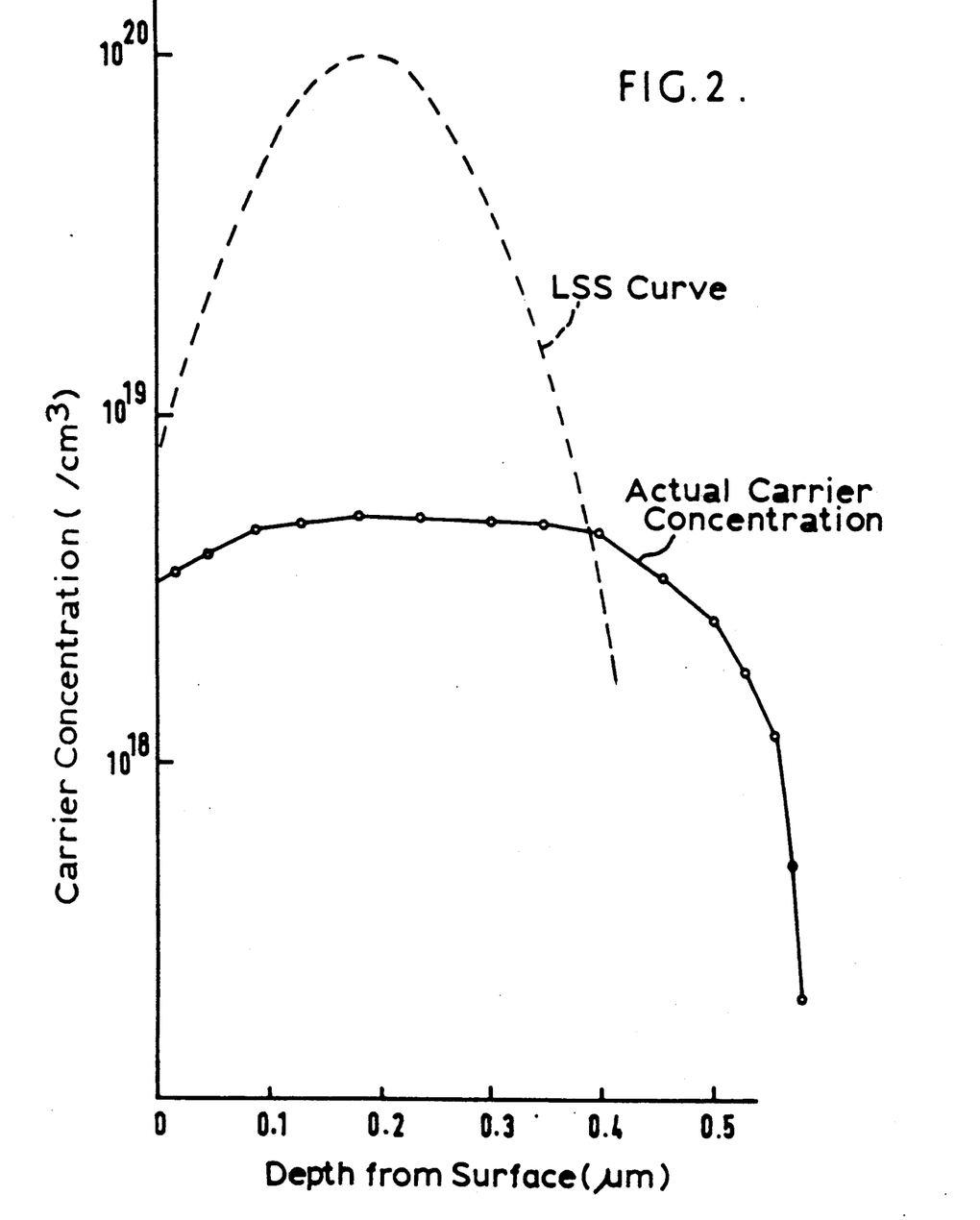
FIG. 2 is a diagram showing the distribution of the carrier concentration for the same case as in FIG. 1.

FIG. 2 shows the distribution of the carrier concentration (solid line) for the implantation of $2 \times 10^{15}$ atoms/cm$^2$. According to the curve determined by the LSS theory, which is represented by a broken line, the peak carrier concentration should reach $1 \times 10^{20}$/cm$^3$. The measured carrier concentration, however, remains at $5 \times 10^{18}$/cm$^3$. This figure also shows an enormous diffusion that occurred during the heat treatment. This diffusion also means that the amount of activated Mg as acceptors is relatively small in quantity.

As for the cause of the low rate of activation of Mg, it is necessary to consider the deviation from the stoichiometric composition of GaAs. In order for Mg to act as an acceptor in GaAs, it is necessary to infiltrate into the Ga lattice site and combine with As. In a GaAs crystal, the density of Ga atom is $2.2 \times 10^{22}$/cm$^3$ so that when Mg is implanted to a concentration of about $1 \times 10^{20}$/cm$^3$ as shown in FIG. 2, it becomes necessary for all of the Mg atoms to activate as acceptors, either by the shift of about 1% of Ga atoms to interlattice positions or by the diffusion into the SiO$_2$ film formed on the surface. However, these changes do not occur to a sufficient extent under usual conditions.

There are some problems in the implanting of Be or Silicon (Si). Though Si infiltrates into the Ga site in the same way as Mg or Be, it behaves as a donor in the GaAs material.

There have also been investigations concerning the implanting of As, which is a compositional element of the GaAs substrate, together with Zn or Si to improve the carrier concentration and/or diffusion. This method, however, is not preferable because of the damage caused by As ion implantation. As has the atomic number 33, which is large compared with 4 of Be, 12 of Mg or 14 of Si. Therefore, the energy of implanting As becomes enormous if attempts are made to obtain a project range comparable with that for Be, Mg or Si. The carrier concentration is limited due to the damage. Therefore, ion implantation using As is not suitable.

SUMMARY OF THE INVENTION

Accordingly, an object of the present invention is to provide an improved method of manufacturing semiconductor devices by ion implantation.

Another object of the invention resides in providing such a process which makes it possible to form a p- or n-type region that has a sufficiently high carrier concentration together with a lowered diffusion in a GaAs or AlGaAs material.

It is also an object of the invention to provide improved semiconductor devices.

In accomplishing the foregoing objects, there has been provided according to this invention a method of manufacturing semiconductor devices by ion implantation, comprising the steps of:
  i) implanting P ions and ions selected from Si or Group II elements to the same region of GaAs or AlGaAs material; and
  ii) performing heat treatment to said ion implanted region for activation.

According to another aspect of this invention there has been provided an improved semiconductor device, comprising:

a structure consisting essentially of an n-type GaAs collector layer, a p-type GaAs base layer and an n-type AlGaAs emitter layer stacked upon each other in the recited order;

a p-type external base region formed in a predetermined region of said structure, with phosphorus and impurities selected from Group II elements and extending in depth from said n-type AlGaAs emitter layer to said n-type GaAs collector layer.

BRIEF DESCRIPTION OF THE DRAWINGS

This invention, together with its various features and advantages, will be readily understood from the following more detailed description presented in conjunction with the following drawings, in which.

DETAILED DESCRIPTION OF THE PREFERRED EMBODIMENTS

According to the invention phosphorus (P) ions that are inactive but are not the compositional elements of a GaAs or AlGaAs material are implanted together with ions selected from Si or Group II elements.

Prior to the description of the method applied to the actual manufacture of the device, certain experimental results will be considered as follows.

Figure 3:
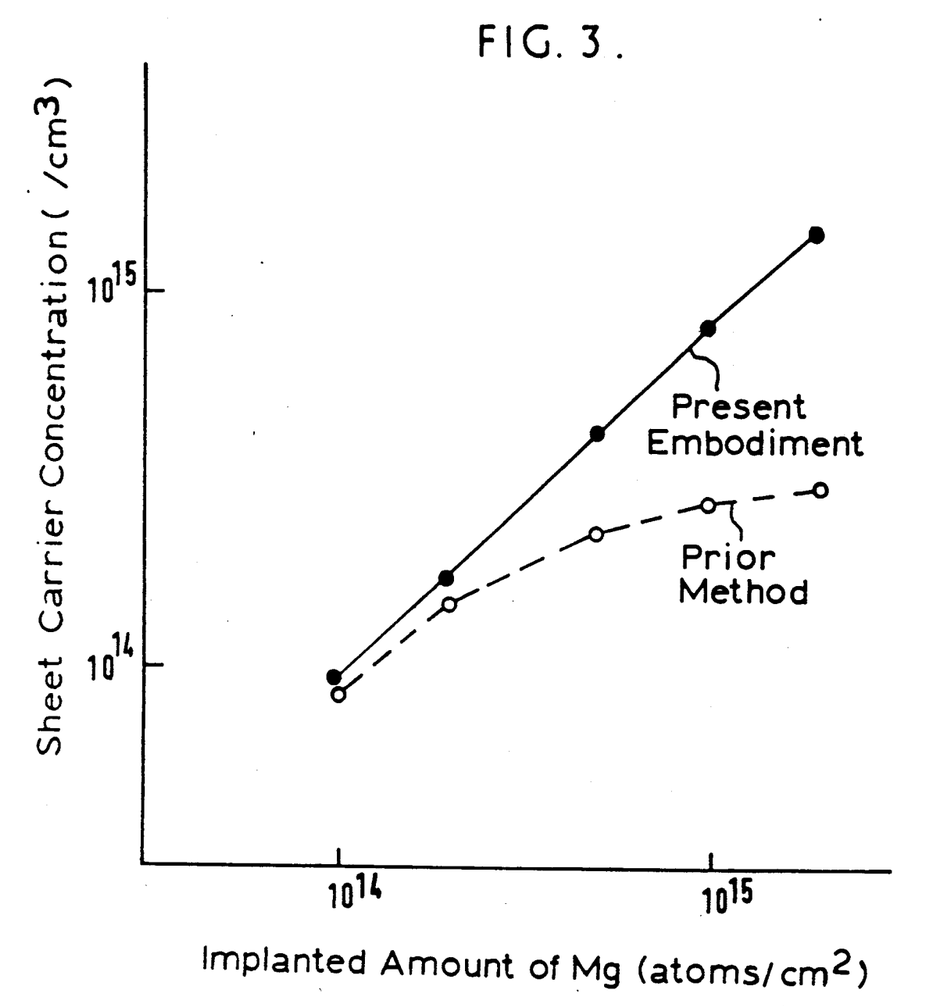
FIG. 3 is a diagram showing the relationship between the amount of Mg implanted in GaAs substrate and the sheet carrier concentration, Mg being implanted together with P in accordance with the present invention.
Figure 4:
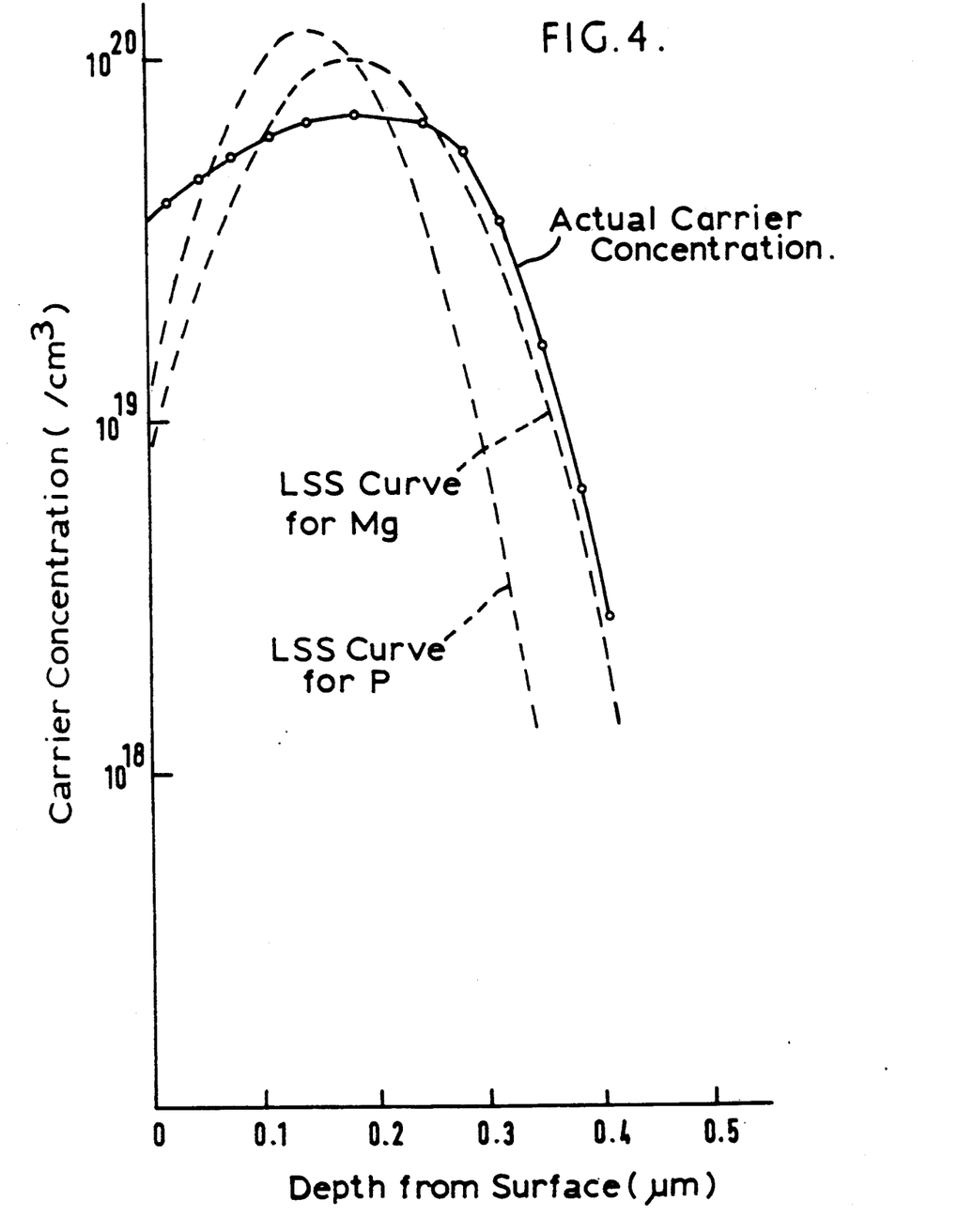
FIG. 4 is a diagram showing the distribution of carrier concentration corresponding to the FIG. 3.

FIG. 3 shows the relationship (solid-line) between the implanted amount of Mg and the sheet carrier concentration of the p-type layer obtained, when equal amounts of Mg and P are ion implanted (P ion implantation was followed by Mg implantation) in a semi-insulating GaAs substrate under the implanting energy of 180 KeV. The project range Rp is about 0.18 /um for Mg+, and 0.15 /um for P+. Also shown in the figure is the result for a prior method (broken line) in which no implantation of P is carried out. The heat treatment of these samples after the ion implantation was carried out by covering the surface with a CVD SiO$_2$ film and heating them to 85° C. for 2 seconds with a halogen lamp. In contrast to the tendency of saturation in the carrier concentration that is seen for the implanted amount of Mg that exceeds $2 \times 10^{14}$ atoms/cm$^2$ in the previous method, according to the present method, the impurity activation factor showed a value as high as 70% even for a high implanted amount of $2 \times 10^{15}$ atoms/cm$^2$. This sheet carrier concentration realizes a value about five times as large compared with the case of the previous method. Further, the distribution of the carrier concentration for the present case is shown in FIG. 4 as a solid line. Due to the simultaneous implantation of P ions, as a result of suppression of abnormal diffusion of Mg caused by the insufficiency of an element of Group V, there is obtained a steep distribution of carrier concentration compared with the previous method, with a peak concentration that reaches $7 \times 10^{19}$/cm$^3$. Also included in FIG. 4 are the results due to the LSS theory (shown in broken lines) for Mg and P at an implanting energy of 180 KeV. It will be understood that the implanted regions of P and Mg are piled upon each other in the GaAs substrate. It also can be understood that the peak concentration of each impurity was about $1 \times 10^{20}$ atoms/cm$^3$ at the implanting step.

In the investigated embodiments, the sheet carrier concentration was measured by the Pauw method, which makes use of the hall effect. As for the distribution of carrier concentration, the measurements were performed as follows. After performing the slight etchings for the surface of the ion implanted region and the sheet carrier concentration measurements described above, alternatively, the volume concentration of each of the carriers was calculated for each etching step by dividing the amount of the change of the sheet carrier concentration by the etching depth as shown in FIG. 4 (solid line). Calculations of the implanted amount were carried out by multiplying the ion current density by ion implanting period according to the conventional method.

Figure 5:
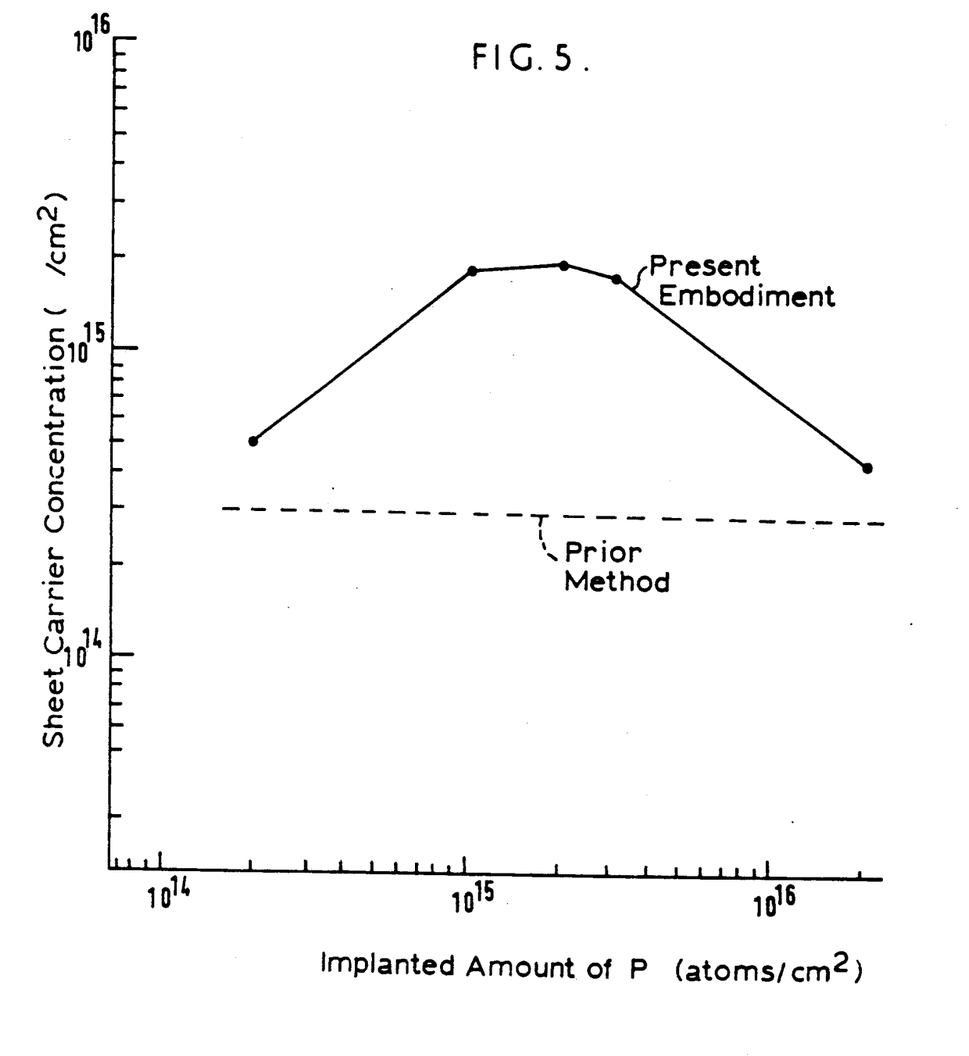
FIG. 5 is a diagram showing the preferable range of the amount of P to the Mg.

FIG. 5 shows the relationship between the amount of P implanted into the semi-insulative GaAs and the sheet resistivity, at a Mg level of $2 \times 10^{15}$ atoms/cm$^2$. The broken line shows the case in which Mg only is implanted into the substrate. In each case, the implanting energy was 180 KeV. The maximum carrier concentration was obtained when the implanted amount of P equals the Mg level. At an implanted amount of $2 \times 10^{15}$ atoms/cm$^2$ for each, the sheet carrier concentration reached $1.4 \times 10^{15}$/cm$^2$. The preferred ratio of the implanted amount of P to Mg atoms is between about 1:10 and 10:1, especially between about 1:2 and 2:1.

Figure 6:
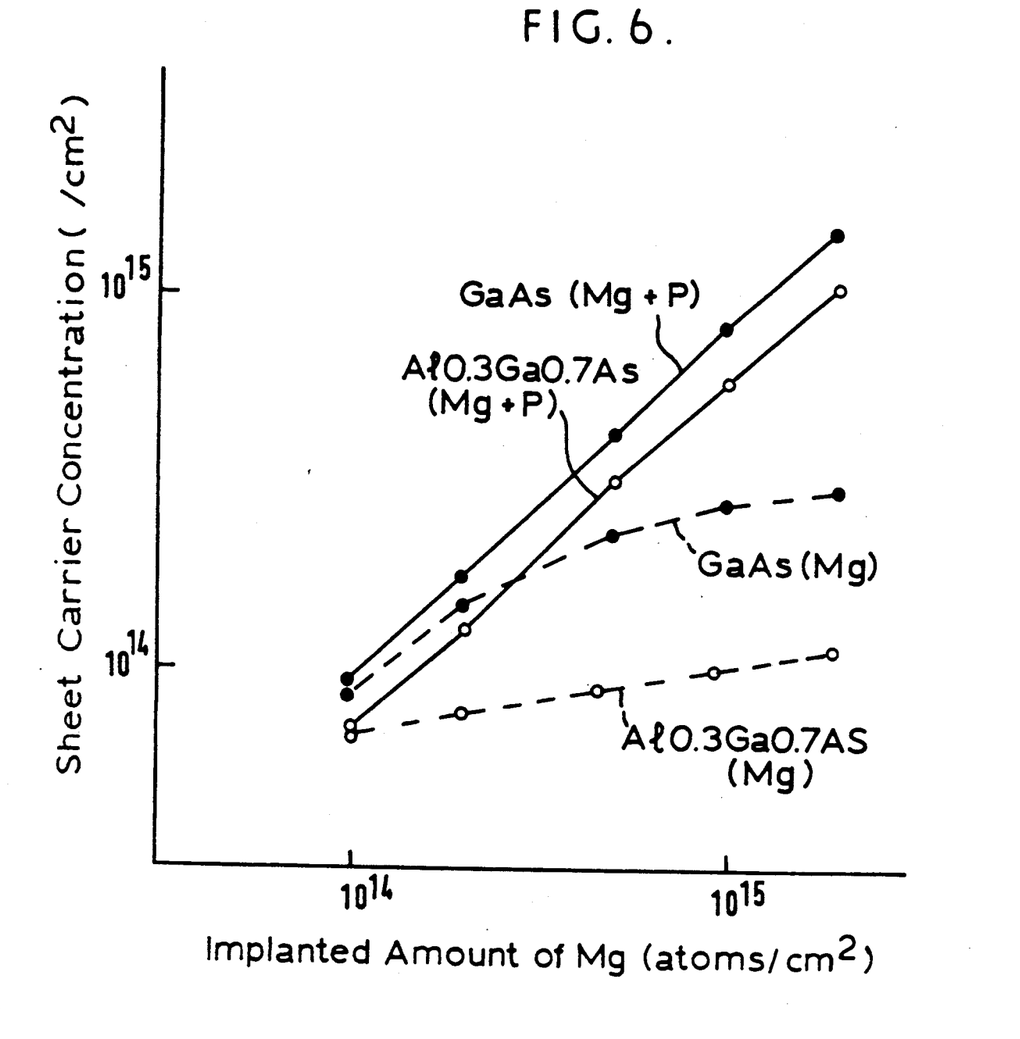
FIG. 6 is a diagram for showing the case in which an AlGaAs substrate is employed.

FIG. 6 is a diagram showing the effect of implanting Mg and P ions into semi-insulative Al$_{0.3}$Ga$_{0.7}$As substrate with an implanted amount of $2 \times 10^{15}$ atoms/cm$^2$ for each type of ion, at 180 KeV.

As a comparison, the cases of (1) implanting Mg alone and (2) using a GaAs substrate are also shown. According to the experiments, it will be understood that the present method supplies an almost equivalent carrier concentration to the AlGaAs substrate as in the case of GaAs.

FIG. 7a to FIG. 7e illustrate cross-sectional structures showing the manufacturing steps for an HBT, to which the present invention is applied.

Figure 7A:
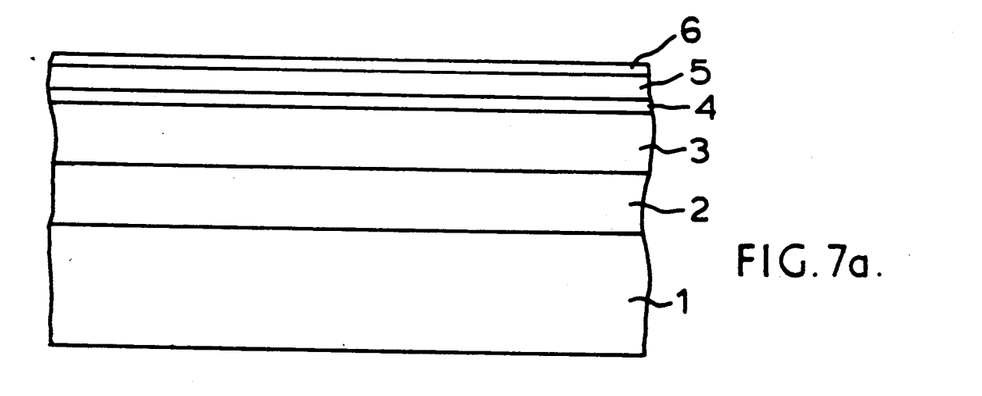
FIGS. 7a through 7e schematically illustrate the manufacturing process for an HBT to which the present invention is applied.

First of all, as shown in FIG. 7a, onto the semi-insulating GaAs substrate 1, an n+-GaAs layer 2 of impurity concentration of $2 \times 10^{18}$ atoms/cm$^3$ and thickness of 5000 Å was grown. Furthermore, an n-GaAs layer 3 of $5 \times 10^{16}$ atoms/cm$^3$ and 5000 Å, a p+-GaAs layer 4 of $1 \times 10^{19}$ atoms/cm$^3$ and 1000 Å, an n-AlGaAs layer 5 of $5 \times 10^{17}$ atoms/cm$^3$ and 2000 Å and an n+-GaAs layer 6 of $5 \times 10^{18}$ atoms/cm$^3$ and 1000 Å were also grown onto it. As for the method of growth of each layer, MBE (Molecular Beam Epitaxy) was used. During the growth of each layer by means of the MBE method, Be or Si was introduced as acceptor or donor impurities at the predetermined concentration shown above.

Figure 7B:
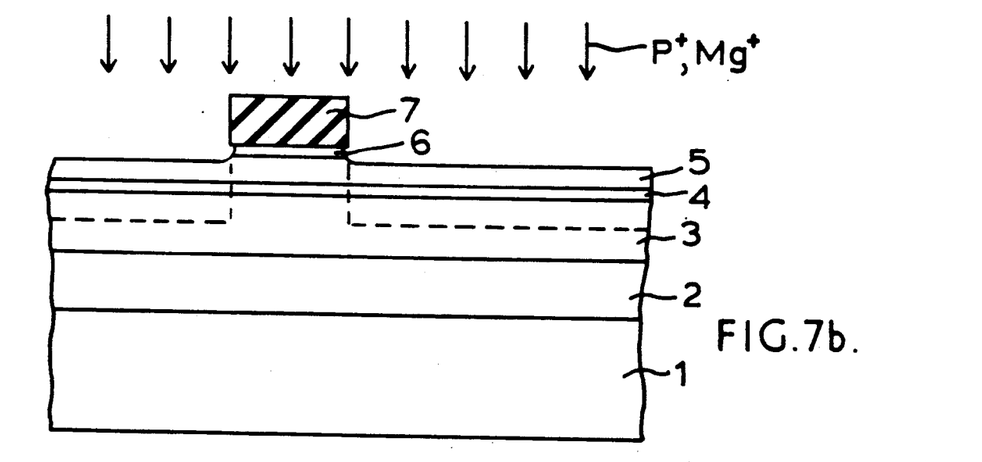

A 8000 Å layer of CVD SiO$_2$ film 7 was then deposited on the surface, and wet etching to the n+-GaAs layer 6 was performed for forming a contact mesa of an emitter using the CVD SiO$_2$ film 7 as an etching mark. Next, P ion implantation in the amount of $2 \times 10^{15}$ atoms/cm$^2$ at 190 KeV, and then Mg ion implantation of $2 \times 10^{15}$ atoms/cm$^2$ at 150 KeV to the region for making an external base region for taking out an electrode were performed. FIG. 7b.

Figure 7C:
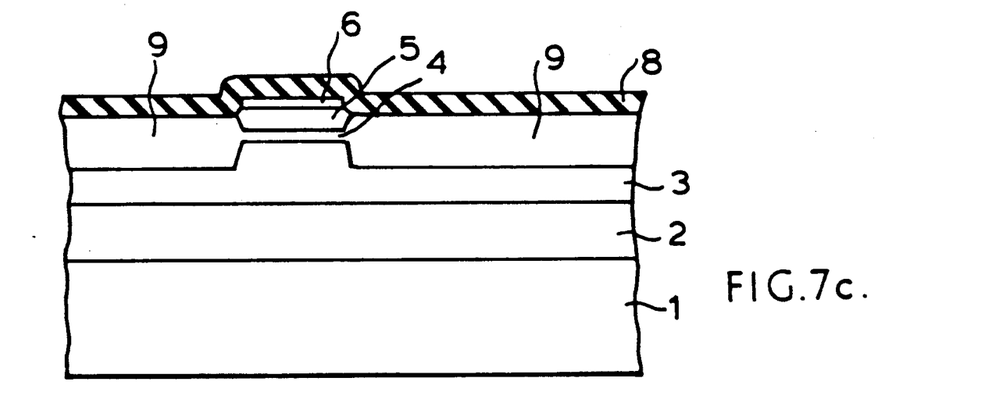

After removing the CVD SiO$_2$ film 7, the sample was covered with a 1500 Å film of CVD SiO$_2$ 8 and was annealed with a halogen lamp at 850° C. for 2 seconds. Due to this annealing, the high concentration p-layer 9 was made at the ion implanted region, as shown in FIG. 7c.

Figure 7D:
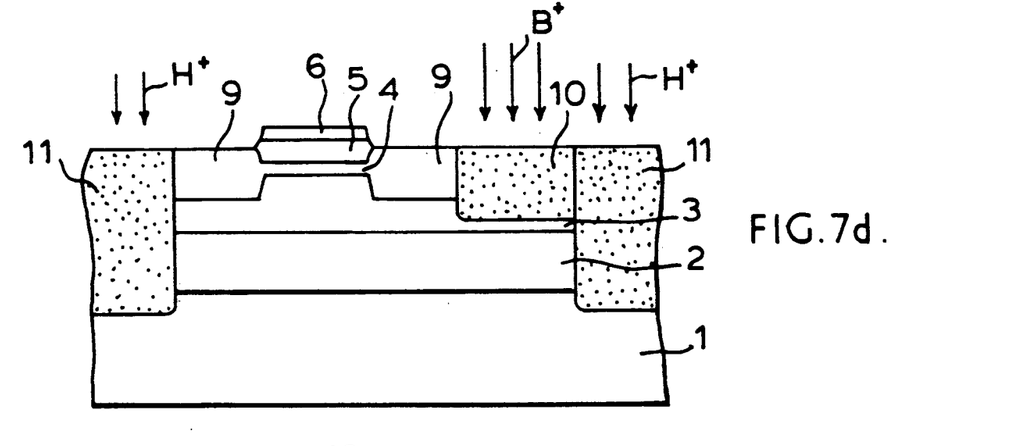

After that step, Boron (B) ions were implanted with $7 \times 10^{12}$ atoms/cm$^2$ at 150 KeV and hydrogen (H) ions were implanted in the amount of $5 \times 10^{14}$ atoms/cm$^2$ at 190 KeV. By these implantations, as shown in FIG. 7d, isolation regions 10, 11 were formed.

Figure 7E:
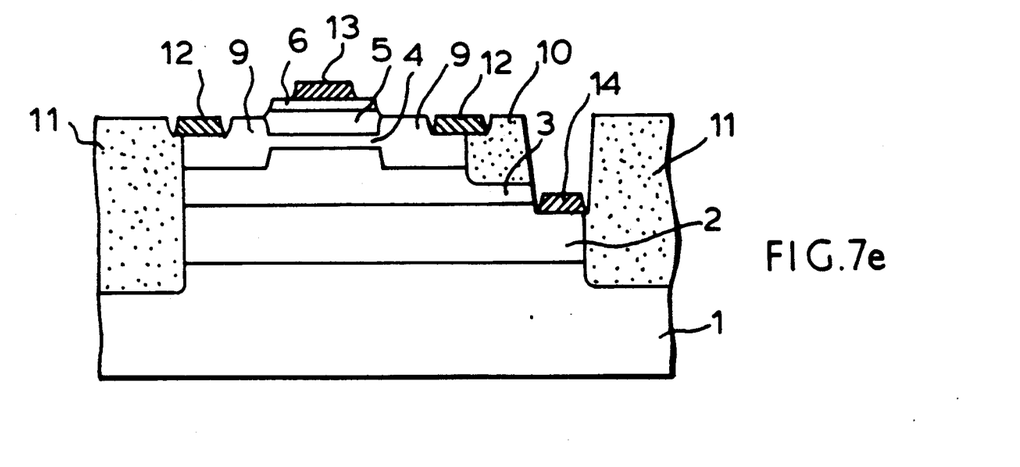

Then, predetermined surface portions were removed by wet etching, and on these portions, AuZn alloy electrode 12 and AuGeNi alloy electrodes 13, 14 were formed. FIG. 7e shows a collector region 3, an inner base region 4, an external base region 9, an emitter region 5 and an external emitter region 6. Further, there is shown a base electrode 12, an emitter electrode 13, a collector electrode 14, respectively.

According to this embodiment, the external base region 9 is formed at a high carrier concentration so that the sheet resistivity of the base region 9 is lowered. Also, the resistivity of the ohmic contact of the base electrode 12 is also lowered.

In the embodiment described above, the emitter region 5 is surrounded by the external base region 9 and is buried in the substrate, and has substantially the same outline compared with that of the inner base region 4.

Figure 8A:
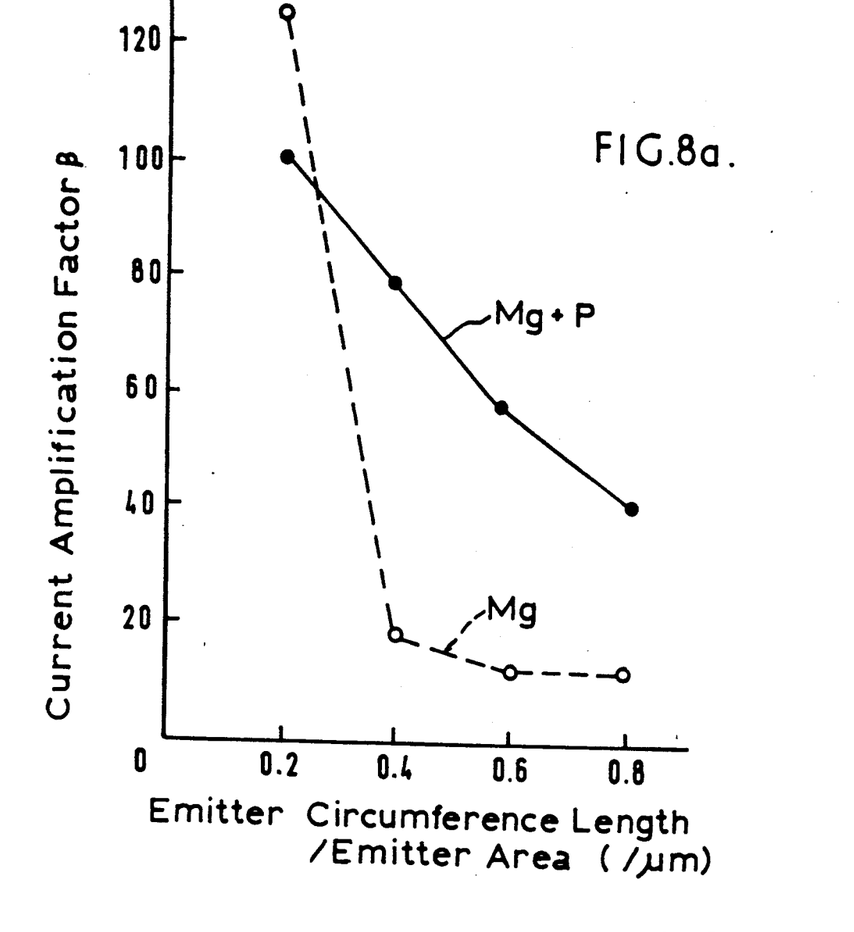
FIG. 8a is a diagram showing the relationship between the emitter circumference length/emitter area, and the current amplification factor $\beta$ for the same device in FIG. 7.
Figure 8B:
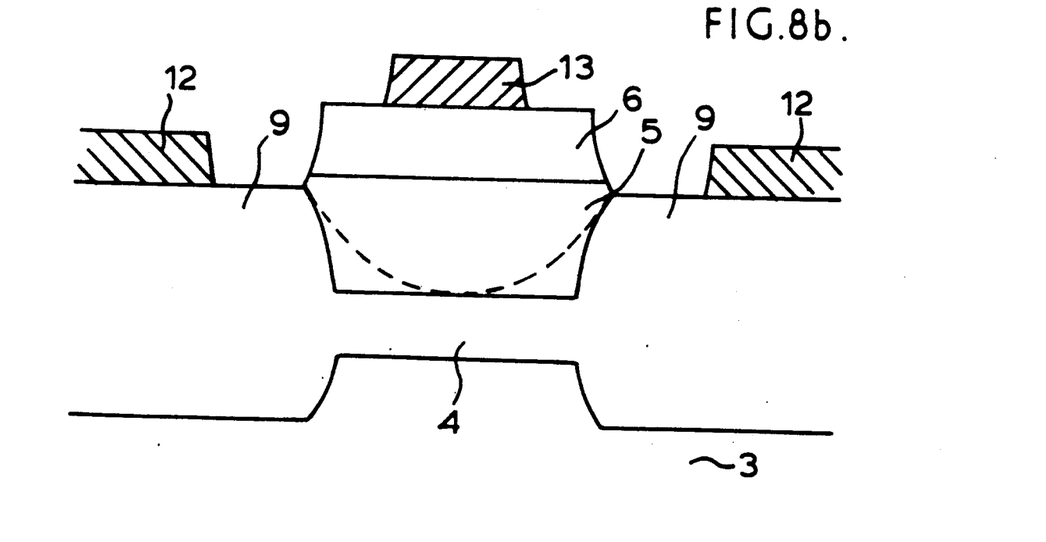
FIG. 8b shows the parts of an HBT.

FIG. 8a shows the relationship observed between the ratio of the emitter circumference length/emitter area and the current amplification factor $\beta$ of the HBT. The solid line shows the device in FIG. 7, and on the other hand, the broken line shows the case of implanting Mg alone.

Upon decreasing the emitter size so that the ratio reaches 0.4 (area is $10 \times 10$ /um$^2$), the current amplification factor $\beta$ of the previous method drops to 20 rapidly. But for the present method, the decrease is at a much lower rate.

An HBT has the feature that the undesirable injection of holes from the base region to the emitter can be effectively prevented because the p-n junction coincides with the hetero junction consisting of GaAs 4 and AlGaAs 5, and this improves the factor $\beta$ to a high degree. Therefore, the rapid lowering of the $\beta$ in the previous method is thought to be a shift of the p-n junction from the boundary of the hetero junction, due to the occurrence of an abnormal Mg diffusion at the corner of the bottom of the emitter region 5 toward the center of emitter region 5, this influence becoming remarkable as the device size decreases.

Figure 9:
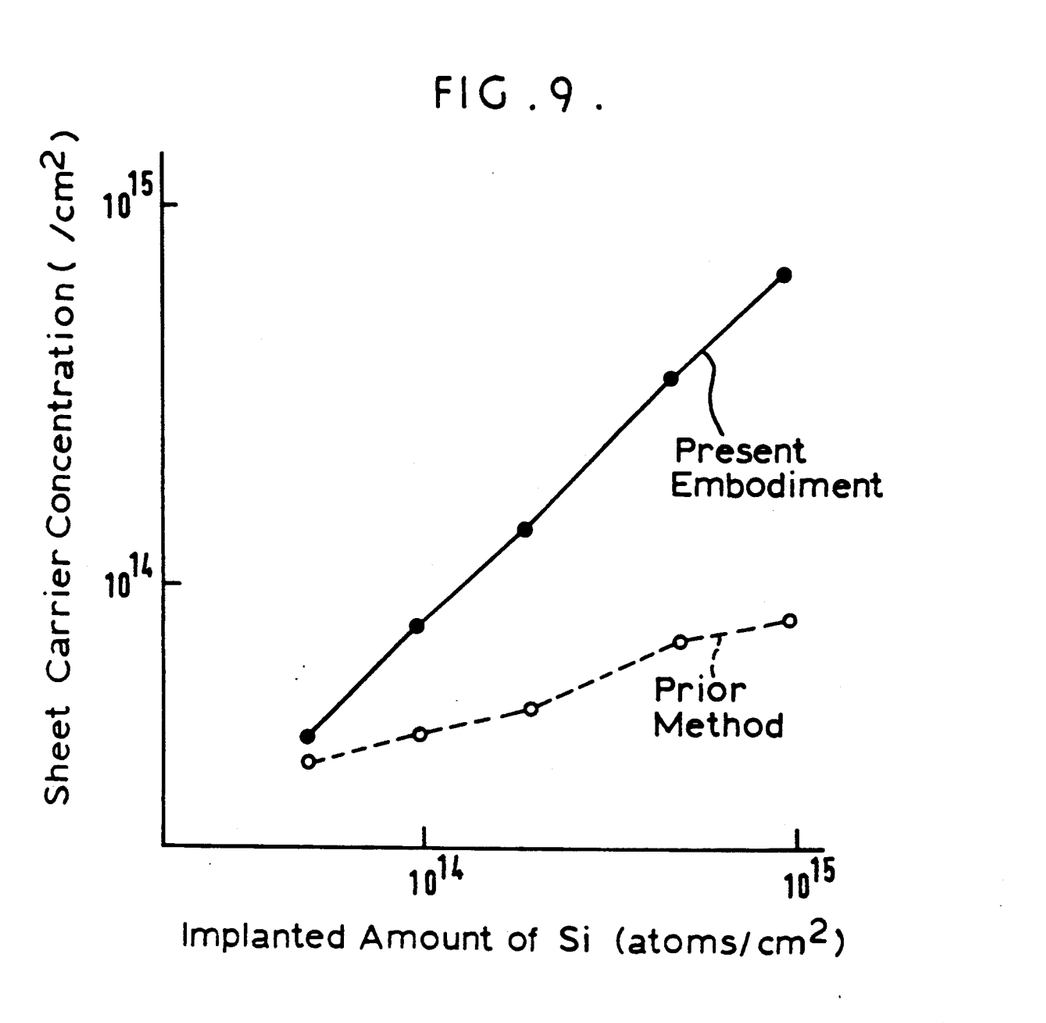
FIG. 9 is a diagram showing the relationship between the amount of Si and the sheet carrier concentration for Si implanted together with P.

FIG. 9 shows the result in which a high concentration n-type layer is formed by the ion implantation of Si and P ions. The P implantation was followed by Si implantation. The solid line shows the data when an equal amount of Si and P were ion implanted in the semi-insulative GaAs substrate with the implanting energy of 130 KeV for Si and 140 KeV for P.

Figure 10:
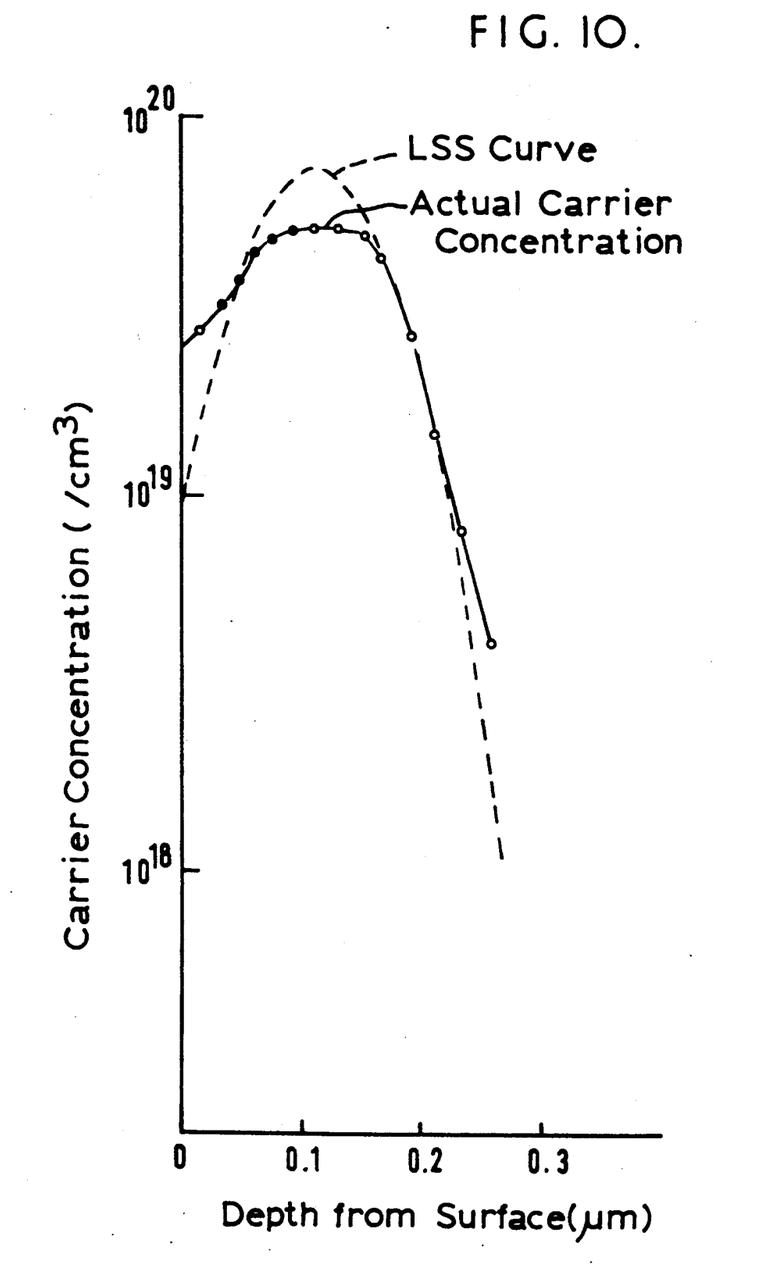
FIG. 10 is a diagram showing the distribution of the carrier concentration for the same case as in FIG. 9.

The broken line is the case when only the P ion implantation was performed. The heat treatment after the ion implantations was carried out by covering the surface with CVD SiO$_2$ film, and then by heating at 1050° C. for 5 seconds with a halogen lamp. Although the activation factor of the carrier for an implanted Si amount of $1 \times 10^{15}$ atoms/cm$^2$ was only 8% by the previous method, it has shown a value as large as 65% by the present method. The distribution of the carrier concentration in this case is shown in FIG. 10 as a solid line. By such a simultaneous use of P ion implantation, the peak carrier concentration reached $5 \times 10^{19}$/cm$^3$.

In FIG. 10, the result of the LSS theory for the cases of implantation of Si and P with the energy of 130 KeV and 140 KeV respectively, is also shown.

It can be understood that the distribution of the concentration for P is the same as that of Si, and diffusion is also prevented.

FIGS. 11a to 11d illustrate a cross-sectional view showing the manufacturing steps for making a MESFET to which Si and P ion implantations are applied.

Figure 11A:
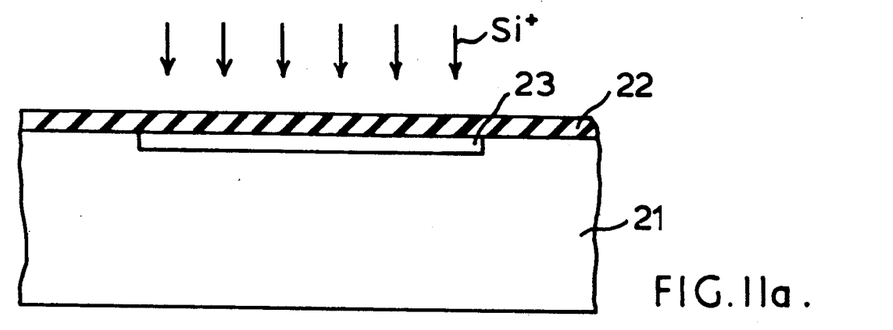
FIGS. 11a through 11d schematically illustrate the manufacturing process for a MESFET (Metal Semiconductor Field Effect Transistor) in accordance with the method shown in FIG. 9.
Figure 11B:
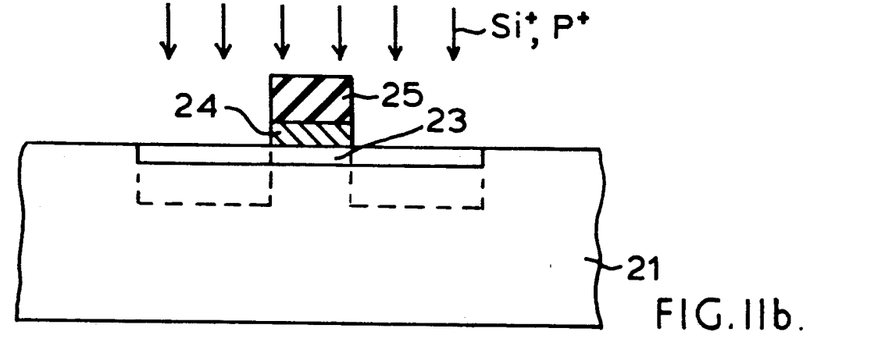

At first, to a semi-insulative GaAs substrate 21, Si with the implanted amount of $2 \times 10^{12}$ atoms/cm$^2$ was selectively implanted at 60 KeV toward its channel region. Then, after covering the surface with a 1500 Å thickness of PSG film 22, the sample was annealed at 850° C. for 10 minutes. Due to this process, an n-type layer 23 was formed as shown in FIG. 11a. Then, a W film 24 was patterned by the RIE method for formation of the shape of a gate electrode using CVD SiO$_2$ film 25 as an etching mask. First P and then Si ions were implanted, each with the implanted amount of $1 \times 10^{15}$ atoms/cm$^2$ at 120 KeV using the gate electrode 24 and the CVD SiO$_2$ film 5 as a mask. The implanted regions were formed as self-aligned regions to the gate electrode 24. FIG. 11b.

Figure 11C:
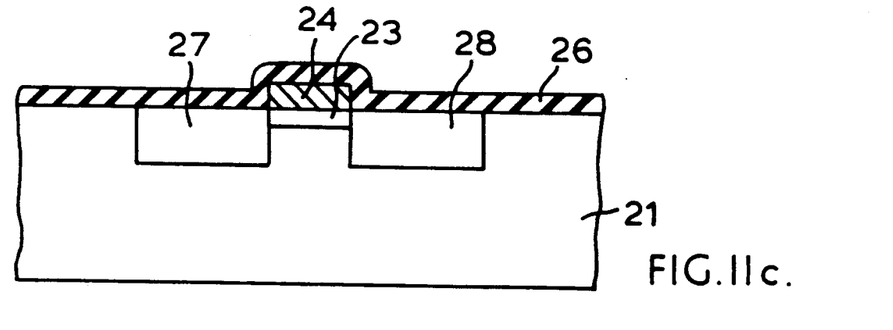

Next, after removing the CVD SiO$_2$ film 25, a PSG film 26 of 1500 Å was formed, and then, by annealing with a halogen lamp at 1050° C. for 5 seconds, high concentration regions of n-type source and drain regions 27 and 28 were produced. FIG 11c.

Figure 11D:
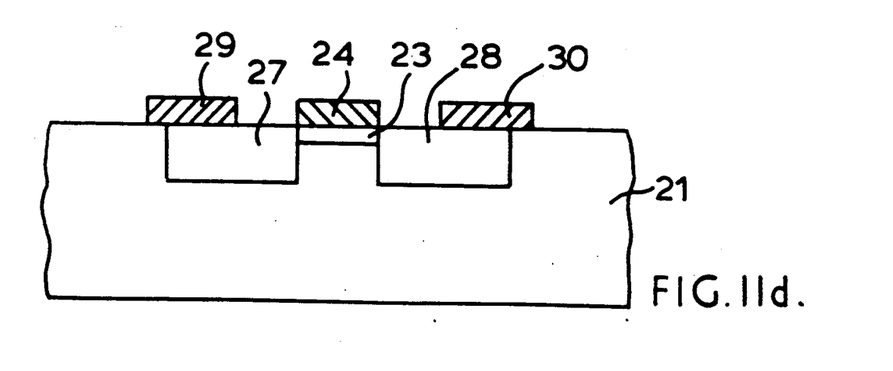

Then, AuGeNi alloy electrodes 29, 30 were formed for ohmic contacts as shown in FIG. 11d. Instead of the AuGeNi alloy electrodes 29, 30, a stacked layer of Ti and Al that is formed on the Ti layer may be used as non-alloy ohmic contact electrodes.

In this embodiment it is possible to obtain source and drain regions 27, 28, that have lowered sheet resistivity and improved contact characteristics.

And also, the high accuracy of the channel length beneath the gate electrode 24 can be achieved due to the improvement for the horizontal diffusion of Si.

In the embodiments described in FIG. 3 to FIG. 8, Mg is used as the acceptor. However, Be can be used instead of Mg. Other acceptors selected from Group II elements (including IIa) such as Zn may be used, if desired. Two types of acceptors also may be used in combination.

In the embodiments of FIG. 9 to FIG. 11, an AlGaAs substrate can be used. And in FIG. 11, Si ions were implanted into the source and drain regions, however, this may be replaced by Mg for a p-channel MESFET. And in FIG. 7 and FIG. 11, although the heat treatment for activation of implanted ions was performed before the formation of contact electrodes 12, 29 and 30, this heat treatment may be performed after forming the electrodes.

In each of the embodiments, the P ion implantation step was followed by another ion implantation, such as Mg ion implantation, and then the heat treatment was performed. However, it can be done by reversing the order of the two implanting steps. Furthermore, these implanting steps can be done at the same time.

For achieving a relatively high carrier concentration, it is preferable to implant ions selected from Si or Group II elements with the implanted amount being more than $1 \times 10^{14}$ atoms/cm$^2$, and with the peak concentration in the distribution being more than $1 \times 10^{19}$ atoms/cm$^3$ at the ion implanting step.

The preferred ratio of the implanted amount of atoms for P ions to the ions selected from Si or Group II elements is between about 1:10 and 10:1, especially between about 1:2 and 2:1.

As for the covering film, CVD SiO$_2$ film (for example, 8 in FIG. 7) was used. However, this may be replaced by other deposited insulating films such as PSG, SiN, SiON or AlN. And as for the heat treatment, it may be performed at 700°–1100° C., and heating by firing can also be used instead of the halogen lamp.

What is claimed is:

1. A semiconductor device, comprising:
   a bipolar transistor structure consisting essentially of an n-type GaAs collector layer, a p-type GaAs base layer and an n-type AlGaAs emitter layer stacked upon each other with the base layer being between the emitter layer and the collector layer;
   a p-type external base region formed in said structure with phosphorus and impurities selected from Group IIa elements, said external base region extending in depth from said n-type AlGaAs emitter layer to said n-type GaAs collector layer.

2. A semiconductor device according to claim 1, wherein said impurities selected from Group IIa elements comprise Mg atoms.

3. A semiconductor device according to claim 1, wherein said impurities selected from Group IIa elements comprise Be atoms.

4. A semiconductor device according to claim 1, wherein said structure is formed on a semi-insulative GaAs substrate.

5. A semiconductor device according to claim 1, wherein said external base region surrounds said emitter layer.

6. A semiconductor device according to claim 1, further comprising an ohmic contact electrode formed on said external base region.

7. A semiconductor device according to claim 1, wherein the amount of said impurities selected from Group IIa elements in said external base region is more than about $1 \times 10^{14}$ atoms/cm$^3$.

8. A semiconductor device according to claim 1, wherein the peak concentration of said impurities selected from Group IIa elements in said external base region is more than about $1 \times 10^{19}$ atoms/cm$^3$.

9. A semiconductor device according to claim i, wherein the ratio of the amount of phosphorus atoms to the impurities selected from Group IIa elements is between about 1:10 and 10:1.

10. A semiconductor device according to claim 1, wherein the ratio of the amount of phosphorus atoms to the impurities selected from Group IIa elements in said external base region is between about 1:2 and 2:1.

* * * * *